(12) United States Patent
Hiramatsu et al.

(10) Patent No.: US 6,700,073 B2
(45) Date of Patent: Mar. 2, 2004

(54) SEMICONDUCTOR DEVICE

(75) Inventors: Seiki Hiramatsu, Tokyo (JP); Satoshi Yanaura, Tokyo (JP); Masuo Koga, Tokyo (JP); Hirofumi Fujioka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/970,029

(22) Filed: Oct. 4, 2001

(65) Prior Publication Data

US 2002/0070439 A1 Jun. 13, 2002

(30) Foreign Application Priority Data

Dec. 13, 2000 (JP) ........................................ 2000-378828

(51) Int. Cl.[7] ................................................. H05K 1/00
(52) U.S. Cl. ...................................... 174/258; 174/260
(58) Field of Search ............................... 174/260, 255; 257/787–796

(56) References Cited

U.S. PATENT DOCUMENTS

| | | | | |
|---|---|---|---|---|
| 4,529,755 A | * | 7/1985 | Nishikawa et al. | 174/52.2 |
| 5,399,805 A | * | 3/1995 | Tyler et al. | 174/52.2 |
| 5,611,884 A | * | 3/1997 | Bearinger et al. | 156/325 |
| 5,621,243 A | * | 4/1997 | Baba et al. | 257/712 |

OTHER PUBLICATIONS

Schnur et al., "Low Inductances, Explosion Robust IGBT Modules In High Power Inverter Applications", IEEE Transactions in Power Electronics, 1996, pp. 1056–1060.

* cited by examiner

Primary Examiner—David L. Talbott
Assistant Examiner—Jeremy Norris
(74) Attorney, Agent, or Firm—Leydig, Voit & Mayer, LTD

(57) ABSTRACT

A silicone resin for sealing a semiconductor chip. A cured silicone resin, which is obtained by curing the silicone resin at a given temperature, has a percent elongation, after fracture, measured at a room temperature, not less than 4% of a penetration number at room temperature. A semiconductor device sealed with the silicone resin, when subjected to a heat cycle or a vibration test, provides resistance to cracking, forming of voids, and interfacial peeling-off. The cured silicone resin may have a penetration number not less than 10 and not more than 80 and a loss elasticity not less than 17% of the storage elasticity. A resin member made of the cured silicone resin and sealing a semiconductor chip may include a filler, such as silica or alumina, having a coefficient of linear thermal expansion lower than that of the cured silicone resin.

11 Claims, 9 Drawing Sheets

Fig. 3

| Sample Number | Type | Viscosity (cP) | Storage Stability | | | TMA (°C) | Appearance |
|---|---|---|---|---|---|---|---|
| | | | 4°C | 25°C | 50°C | | |
| No.1 | I | 550 | 3 M more | 3 M | 3 M | -40 | |
| No.2 | I | 990 | 3 M more | 3 M | 3 M | -40 | |
| No.3 | I | 1050 | 3 M more | 3 M | 3 M | -40 | |
| No.4 | I | 1130 | 3 M more | 3 M | 3 M | -40 | |
| No.5 | I | 1370 | 3 M more | 3 M | 3 M | -40 | |
| No.6 | I | 1400 | 3 M more | 3 M | 3 M | -40 | |
| No.7 | I | 1440 | 3 M more | 3 M | 3 M | -40 | |
| No.8 | I | 920 | 3 M more | 3 M | 3 M | -40 | |
| No.9 | I | 380 | 3 M more | 3 M | 3 M | -40 | |
| No.10 | II | 400 | 3 M more | 3 M | 3 M | -40 | |
| No.11 | II | 450 | 3 M more | 3 M | 3 M | -80 | |
| No.12 | II | 410 | 3 M more | 3 M | 3 M | -40 | |
| No.13 | II | 400 | 3 M more | 3 M | 3 M | -40 | |
| No.14 | II | 440 | 3 M more | 3 M | 3 M | -80 | |
| No.15 | I | 420 | 3 M more | 3 M | 3 M | -40 | Transparent - Light Yellow |
| No.16 | I | 440 | 3 M more | 3 M | 3 M | -40 | |
| No.17 | I | 490 | 3 M more | 3 M | 3 M | -40 | |
| No.18 | I | 1080 | 3 M more | 3 M | 3 M | -40 | |
| No.19 | I | 1130 | 3 M more | 3 M | 3 M | -40 | |
| No.20 | II | 360 | 6 M more | 3 M | 3 M | -40 | |
| No.21 | II | 900 | 6 M more | 3 M | 3 M | -40 | |
| No.22 | II | 910 | 6 M more | 3 M | 3 M | -40 | |
| No.23 | II | 1000 | 6 M more | 3 M | 3 M | -40 | |
| No.24 | II | 1000 | 6 M more | 3 M | 3 M | -40 | |
| No.25 | I | 870 | 3 M more | 3 M | 3 M | -40 | |
| No.26 | I | 880 | 3 M more | 3 M | 3 M | -40 | |
| No.27 | I | 1080 | 3 M more | 3 M | 3 M | -40 | |
| No.28 | I | 1100 | 3 M more | 3 M | 3 M | -40 | |
| No.29 | I | 800 | 3 M more | 3 M | 3 M | -80 | |
| No.30 | II | 500 | 3 M more | 3 M | 3 M | -55 | |
| No.31 | II | 500 | 6 M more | 3 M | 3 M | -80 | |

M:Month

Fig.4

| Sample Number | Cure Condition | Penetration Number (mm) | Percent Elongation (%) | HC test (-40°C-125°C) Cracked (Y/N) | HC test (-40°C-125°C) Voided (Y/N) | Flame Resistance (V-1 test) |
|---|---|---|---|---|---|---|
| No.17 | 125°C×2h | 40 | 6.3 | N | N | × |
| No. 1 | 125°C×2h | 47 | 6.2 | N | N | × |
| No.23 | 70°C×1h | 47 | 7.2 | N | N | ○ |
| No.26 | 125°C×2h | 48 | 7 | N | N | × |
| No. 5 | 125°C×2h | 49 | 7.3 | N | N | × |
| No. 6 | 125°C×2h | 50 | 7.5 | N | N | × |
| No.12 | 75°C×1h | 50 | 7 | N | N | ○ |
| No.20 | 80°C×2h | 50 | 8 | N | N | × |
| No.24 | 70°C×1h | 50 | 7.8 | N | N | ○ |
| No.28 | 125°C×2h | 50 | 8.1 | N | N | × |
| No. 2 | 125°C×2h | 51 | 6.9 | N | N | × |
| No. 7 | 125°C×2h | 51 | 7.6 | N | N | × |
| No. 8 | 125°C×2h | 51 | 7.8 | N | N | × |
| No. 3 | 125°C×2h | 55 | 7.3 | N | N | × |
| No.10 | 125°C×2h | 55 | 6.5 | N | N | ○ |
| No.30 | 125°C×1h | 55 | 1.5 | Y | N | × |
| No.11 | 75°C×1h | 60 | 6.9 | N | N | × |
| No.14 | 75°C×1h | 60 | 7.2 | N | N | ○ |
| No.19 | 125°C×2h | 60 | 9.9 | N | N | × |
| No.13 | 75°C×1h | 61 | 7.1 | N | N | ○ |
| No. 4 | 125°C×2h | 63 | 9.2 | N | N | × |
| No.22 | 80°C×2h | 63 | 10.5 | N | N | × |
| No.25 | 125°C×2h | 63 | 10.2 | N | N | × |
| No.27 | 125°C×2h | 64 | 9.6 | N | N | × |
| No.21 | 80°C×2h | 78 | 12.9 | N | N | ○ |
| No.16 | 125°C×2h | 79 | 13.2 | N | N | × |
| No.29 | 125°C×1h | 80 | 2.6 | Y | Y | × |
| No.18 | 125°C×2h | 82 | 12.7 | N | N | × |
| No.31 | 70°C×1h | 95 | 2.9 | Y | Y | ○ |
| No. 9 | 125°C×2h | 115 | 17.1 | N | Y | × |
| No.15 | 125°C×2h | 125 | 19.1 | N | Y | × |

| Sample Number | Penetration Number(mm) | | B/A (%) | HC test (-55°C-125°C) Cracked? (Y/N) |
| --- | --- | --- | --- | --- |
| | +25°C A | -80°C B | | |
| No.10 | 55 | 20 | 36 | Y |
| No. 4 | 63 | 25 | 40 | Y |
| No.11 | 60 | 55 | 92 | N |
| No.14 | 60 | 56 | 93 | N |

Shear Elasticity of Resin No.29

Fig.9

| Sample Number | Frequency | Storage Elasticity G' (dyn/cm$^2$) | Loss Elasticity G'' (dyn/cm$^2$) | G''/G' (%) | HC Test (-40°C-125°C) Cracked? (Y/N) |
|---|---|---|---|---|---|
| No.29 | 0.1 Hz | 7.40E+03 | 3.20E+02 | 5 | Y |
| | 1.0 Hz | 8.00E+03 | 1.30E+03 | 16 | |
| | 10 Hz | 1.10E+04 | 5.40E+03 | 49 | |
| No.25 | 0.1 Hz | 1.80E+04 | 3.50E+03 | 19 | N |
| | 1.0 Hz | 2.60E+04 | 1.10E+04 | 42 | |
| | 10 Hz | 5.30E+04 | 4.00E+04 | 75 | |
| No.12 | 0.1 Hz | 3.40E+04 | 8.00E+03 | 24 | N |
| | 1.0 Hz | 5.10E+04 | 2.60E+03 | 51 | |
| | 10 Hz | 1.10E+05 | 7.00E+04 | 64 | |
| No.10 | 0.1 Hz | 8.00E+03 | 4.10E+03 | 51 | N |
| | 1.0 Hz | 1.70E+04 | 1.40E+04 | 82 | |
| | 10 Hz | 5.00E+04 | 4.40E+04 | 88 | |
| No.27 | 0.1 Hz | 1.80E+04 | 1.00E+04 | 56 | N |
| | 1.0 Hz | 4.00E+04 | 3.10E+04 | 77 | |
| | 10 Hz | 1.00E+05 | 9.00E+04 | 90 | |

SEMICONDUCTOR DEVICE

BACKGROUND OF THE INVENTION

1. Field of the Invention

The present invention relates to a semiconductor device sealed with silicone resin.

2. Description of the Prior Art

Silicone resin is an organosilicon compound which has a basic structural formula where silicon having an organic group combines alternately with oxygen. Silicone resin has been used generally as an insulating material for sealing power semiconductor devices or the like, because of its small cure-shrinkage and excellent hermetic performance.

FIG. 10 is a cross-sectional side view of a power semiconductor device sealed with a silicone resin. In the figure, an emitter plate 1 is laid over a collector plate 2 with an insulation plate 3 in-between and three of them are accommodated in a resin case 5 together with a control board 4. A resin member 6b, which is formed of a conventional semiconductor sealing resin, occupies the inside of the resin case 5. A metal base plate 7, which constitutes a bottom surface of a power semiconductor device, is fixedly attached to the resin case 5. A ceramic substrate 8 is provided for heat radiation and its both surfaces are respectively bonded to an upper substrate electrode 9 and a lower substrate electrode 10. The lower substrate electrode 10 is soldered with the metal base plate 7. A power semiconductor chip 11 is soldered to an upper surface of the upper substrate electrode 9 and is operative upon receiving a control signal from the control board 4.

Aluminum wires 12 connect the emitter plate 1, the collector plate 2, the upper substrate electrode 9, and the power semiconductor chip 11 with each other. A lid 14 is bonded to an upside opening portion of the resin case 5. The resin case 5, the metal base plate 7, and the lid 14 constitute a casing member. The control board 4 communicates by way of an outside terminal base 15. Inside terminal bases 13 support the weight of the control board 4 by way of connection poles 16. The emitter plate 1, which is layered with the collector plate 2 by way of the insulation plate 3, is bonded to the metal base plate 7 with an aid insulation plate 17 in-between.

The emitter plate 1, the insulation plate 3 and the collector plate 2 are bonded each other usually with adhesive sheets in-between for the purpose of constructing a laminated plate of the emitter plate 1 and the collector plate 2. Bonding with an adhesive sheet produces a large number of gaps in the adhesive portions. Although the gaps are in a reduced-atmosphere at an early stage, they will be soon in a normal atmosphere when left untouched. When the gaps in a normal atmosphere are heated in a heat cycle test or a power cycle test, air in the gaps is pushed out toward the resin member 6b and leads to the formation of voids (see FIG. 11A). Voids are formed in the cycle tests between the ceramic substrate 8 and the upper/lower substrate electrodes 9,10 or between the metal base plate 7 and the lower substrate electrode 10.

Here, the power cycle test is a test in which the power semiconductor chip 11 is repeatedly subjected to an ON/OFF drive so as to heat the power chip up to a temperature approximately 100°C. On the other hand, the heat cycle test is a test in which the power semiconductor device is put in an oven to make the whole device hot and cool repeatedly.

A vibration test also develops some voids from remaining gaps, which induce cracking (splits) in the resin member 6b (see FIG. 11B). The coefficient of linear thermal expansion of the ceramic substrate 8 (ca. $5 \times 10^{-6}/°$ C.) and that of the power semiconductor chip 11 (ca. $4.5 \times 10^{-6}/°$ C.) are not more than 1/100 of the coefficient of linear thermal expansion of the resin member 6b (ca. $1 \times 10^{-3}/°$ C.). Then, performing the heat cycle or the power cycle develops a peeling-off at an interface between the insulation plate 3 and the resin member 6b (FIG. 11C). The interfacial peeling-off also occurs in the vicinity of the power semiconductor chip 11 or the ceramic substrate 8, sometimes accompanying a destructive cracking in the resin member 6b.

Further, the control board 4, which is fixedly attached to the power semiconductor chip 11, becomes an obstacle against the deformation of the resin member 6b, when the resin member 6b expands or shrinks corresponding to the heat/power cycles or the vibration cycle. Hence, cracking is formed from the end portion of the control board 4 and the aluminum wires 12 are crack-ruptured.

The above-mentioned cracking or the interfacial peeling-off of the resin member 6b or the rupturing of the aluminum wires 12 hardly occur, when a bottom area of the casing member is sufficiently large compared with a height of the casing member (for example, not less than $1 \times 10^1$) or such a bottom area is sufficiently small compared with the height of the casing member (for example, not more than $1 \times 10^{-5}$). Since a general power semiconductor device has a (height)/(bottom area) of $2 \times 10^{-3}$ (1/mm), for example, the device is liable in structure to cause cracking and interfacial peeling-off in the resin member 6b or rupturing of the aluminum wires 12.

When a high voltage is applied to a portion where the voids, the cracks or the interfacial peeling-off are formed, there arises a drawback that noises derived from a partial discharge (a micro discharge) cause a failure of the power semiconductor chip 11 to function properly. Further, there has been another drawback that the connection reliability of the aluminum wires is lowered to result in a false operation of the power semiconductor device, because the aluminum wires, which are ruptured by the cure shrinkage of the resin member 6b, increase a voltage load applied to other aluminum wires.

SUMMARY OF THE INVENTION

Accordingly, it is an object of the present invention to minimize the formation of voids, cracks or interfacial peeling-off in a resin member of a semiconductor device even if a heat cycle, a vibration cycle or the like is applied to the semiconductor device.

A semiconductor device according to the present invention comprises a semiconductor chip which is fixedly located over a metal base plate, a resin member which is formed of a silicone resin and seals the semiconductor chip, and a casing member which surrounds the resin member and is capable of externally supplying electric power to the semiconductor chip, wherein a cured silicone resin, which is obtained by curing the silicone resin at a given temperature, has a number of percent elongation after fracture measured at a room temperature not less than 4% of a penetration number at a room temperature.

The cured silicone resin may have a penetration number at a room temperature not less than 10 and not more than 80 and a loss elasticity not less than 17% of the storage elasticity. The resin member may include a filler, such as silica or alumina.

BRIEF DESCRIPTION OF THE DRAWINGS

FIG. 3 is a table for explaining basic characteristics of semiconductor sealing resins.

FIG. 4 is a table for explaining physical properties of semiconductor sealing resins and results of a heat cycle test.

FIG. 9 is a table for explaining a result obtained by measuring the shear elasticity of semiconductor sealing resins.

DESCRIPTION OF THE PREFERRED EMBODIMENTS

The present invention is described in detail hereinafter in conjunction with some embodiments for carrying out the invention. A power semiconductor device, which generates a large difference in temperature owing to an ON/OFF drive of a power semiconductor chip, is required to satisfy particularly severe specifications on the avoidance of voids, cracks and the like. While the power semiconductor chip with a high power consumption or a high applying voltage exhibits the sufficient characteristics in accordance with the present invention, other types of semiconductor chips, irrespective of a type and a capacity, may also be treated.

First Embodiment of Semiconductor Device

Figure 1:
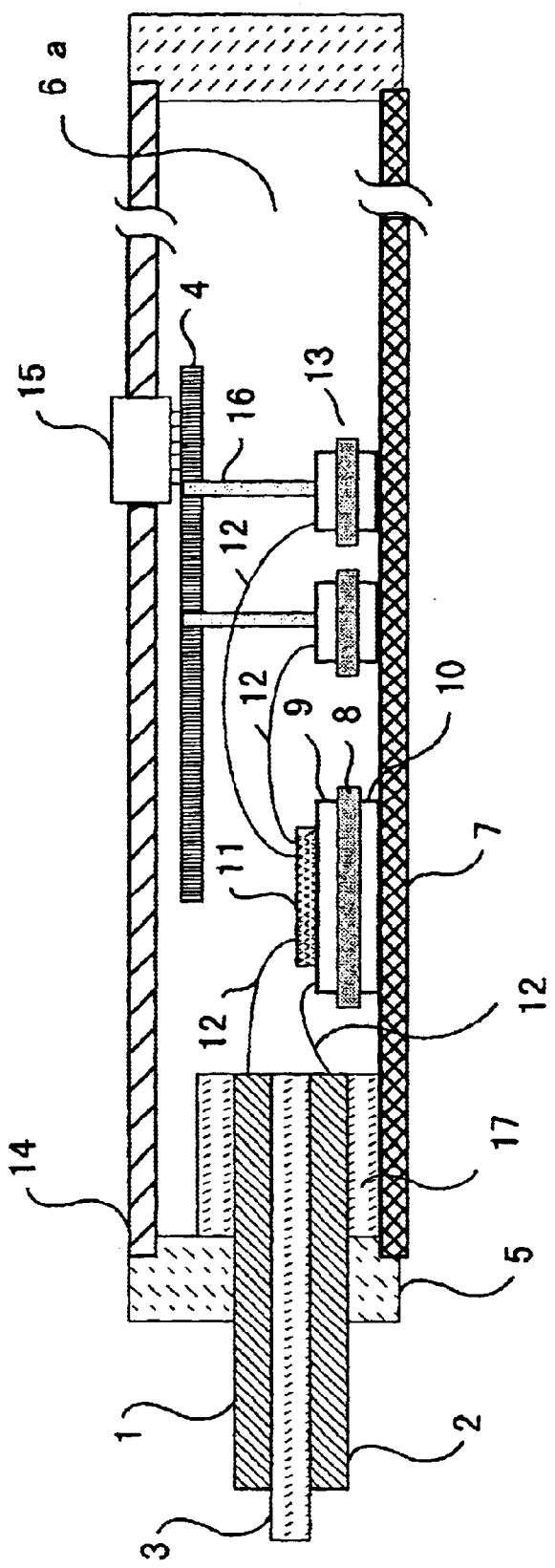
FIG. 1 is a cross-sectional side view showing the first embodiment of a power semiconductor device according to the present invention.

FIG. 1 is a cross-sectional side view of a power semiconductor device which is sealed with a semiconductor sealing resin according to the present invention (hereinafter referred to as semiconductor sealing resin A). In the drawing, an emitter plate 1 is laid over a collector plate 2 with an insulation plate 3 in-between and three of them are accommodated in a resin case 5 together with a control board 4. The resin case 5 is occupied with a resin member 6a, which is made of the semiconductor sealing resin A. The method of preparing the semiconductor sealing resin A will be explained later in detail with references to Examples 1 to 7.

The resin case 5 is fixedly attached to a metal base plate 7, which is provided for heat radiation. Since a power semiconductor chip 11 generates heat in large quantities, the metal base plate 7 is made of a material having an excellent heat conductivity such as copper (provided with a nickel plating on a surface thereof), molybdenum and the like. A refrigerant may be made to flow inside the metal base plate 7 so as to enhance a cooling effect. A ceramic substrate 8 is provided for heat radiation and its both surfaces are bonded respectively to an upper substrate electrode 9 and a lower substrate electrode 10. The ceramic substrate 8 is made of such a material as $Al_2O_3$, SiN, AlN, $SiO_2$, BN and the like. Inside terminal bases 13 are similar in structure, but not in a dimension nor in a shape, to the ceramic substrate 8 to which the upper substrate electrode 9 and the lower substrate electrode 10 are bonded.

The lower substrate electrode 10 is soldered with the metal base plate 7. The power semiconductor chip 11 bonded to an upper surface of the upper substrate electrode 9 is fixedly attached to the metal base plate 7 and the power semiconductor chip 11 is operative upon receiving a control signal (gate signal) from the control board 4.

IGBT (Insulated Gate Bipolar Transistor), GTO (Gate Turn-off Thyristor), Diode and the like, irrespective of their capacities and types, are applicable to the power semiconductor chips 11. While a single power semiconductor chip 11 is depicted in FIG. 1, a plurality of power semiconductor chips 11, connected in parallel or in series, may also be arranged on a metal base plate 7. Power semiconductor chips with a chip capacity not less than 150 kW may be in use. A HVIPM (High Voltage Integrated Power Module, 3.3 kv/1.2 kA), which accommodated 12 IGBT chips of 330 kW (3.3 kV/0.1 kA) in parallel connection, has been fabricated.

The emitter plate 1, the collector plate 2, the upper substrate electrode 9, the power semiconductor chip 11 and the inside terminal bases 13 are respectively connected with each other by aluminum wires 12. Since the control board 4 is supported by the inside terminal bases 13, the control board 4 keeps himself from weighting directly down to the power semiconductor chip 11. A lid 14, which is formed from glass epoxy resin or the like, is bonded to an upside opening portion. of the resin case 5. The resin case 5, the metal base plate 7 and the lid 14 constitute a casing member. The control board 4 communicates with a surrounding of the casing member through an outside terminal base 15.

The method of fabricating the power semiconductor device is explained thereinafter. The ceramic substrate 8 to which the upper substrate electrode 9 and the lower substrate electrode 10 have been bonded is fixedly attached to an upper portion of the metal base plate 7 by a reflow soldering. Further, the power semiconductor chip 11 is soldered with the upper substrate electrode 9 to make a fixed attachment with an upper portion of the metal base plate 7. Then, the emitter plate 1 and the collector plate 2, which are preliminarily bonded with each other to the insulation plate 3, are adhered to the metal base plate 7 with inserting an aid insulation plate 17. Then, the emitter plate 1, the collector plate 2, the upper substrate electrode 9, the power semiconductor chip 11 and the inside terminal base 13 are bonded with each other by aluminum wires 12. Thereafter, the control board 4, which is preliminarily provided with the connection poles 16, is connected to the inside terminal bases 13. Then, the resin case 5 is mounted on the metal base plate 7.

Semiconductor sealing resin A is injected into the resin case 5 up to a level a little above the control board 4 while reducing the pressure inside the resin case 5 to ca. 13 Pa (ca. 0.1 Torr), and is left as it is for approximately 10 minutes to perform a degassing. Since the semiconductor sealing resin A has a proper viscosity, injected semiconductor sealing resin A intrudes into every corners of the resin case 5. Then, heating the resin case for a cure time at an cure temperature gives the resin member 6a. Then, the lid 14 is bonded to an upside opening portion of the resin case 5. The method for injecting the semiconductor sealing resin A is like a method for a conventional sealing resin and hence, no new injection machine is required to be introduced.

A high voltage, for example, ca. 3 kV is applied to the power semiconductor chip 11 and the upper substrate electrode 9 during the operation of the power semiconductor device. Since the power semiconductor chip 11 and the ceramic substrate 8 are covered entirely with the resin member 6a, a higher breakdown voltage for surface creeping discharge is ensured with a small distance. Further, when ceramic such as an aluminum nitride having a high heat conductivity is used as a material of the ceramic substrate 8, heat generated by the power semiconductor chip 11 is transmitted to the metal base plate 7 with high efficiency.

Figure 11A:
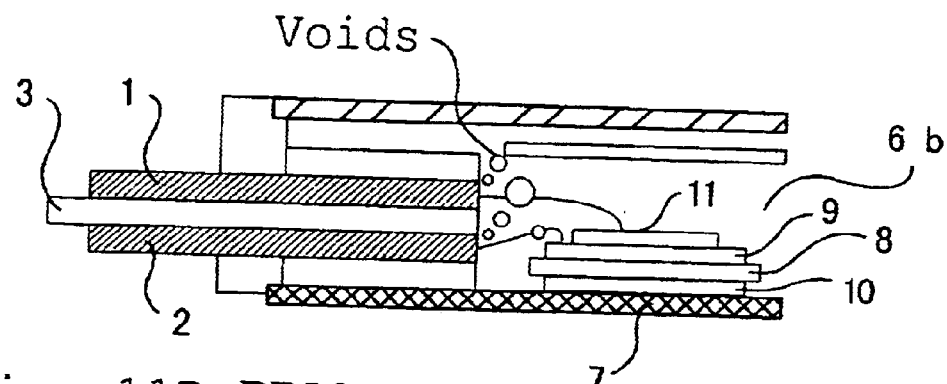
FIGS. 11A–11C are views for explaining voids, cracking and interfacial peeling-off which are formed in a resin member of the conventional power semiconductor device.
Figure 11B:
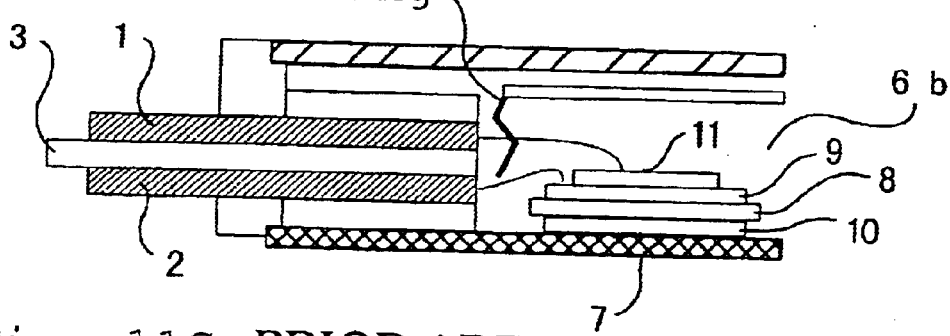
Figure 11C:
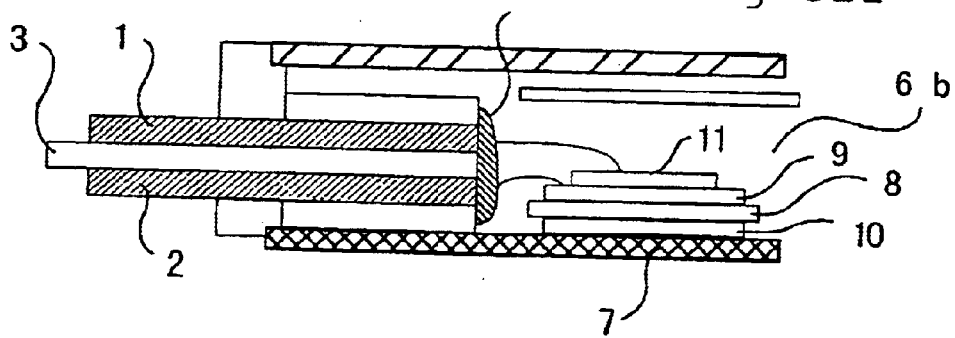

Since the power semiconductor device according to the present invention comprises the resin member 6a formed of the semiconductor sealing resin A, it becomes possible to prevent the formation of voids (see FIG. 11A), cracking (see FIG. 11B) and an interfacial peeling-off (see FIG. 11C) in the resin member 6a at a heat cycle test, a power cycle test or a vibration test (for example, 10–500 Hz, 10G, XYZ directions for 2 hours).

The control board may be mounted on the outside of the casing member. Control signals to the power semiconductor chip 11 are supplied inside the casing member through the outside terminal base 15. By mounting the control board outside the casing member, stress concentrating portions of the resin member 6a decrease in number at the time of performing the heat cycle test, the power cycle test or the vibration test. As a result, the formation of voids, cracks and interfacial peeling-off and the ruptures of the aluminum wires are suppressed and hence, the reliability of the power semiconductor device can be enhanced. Further, providing the control board outside the casing member makes the exchange of the control board easy and hence versatile demands of the power semiconductor device is more easily accomplished to lower the fabrication cost.

Second Embodiment of Semiconductor Device

Figure 2:
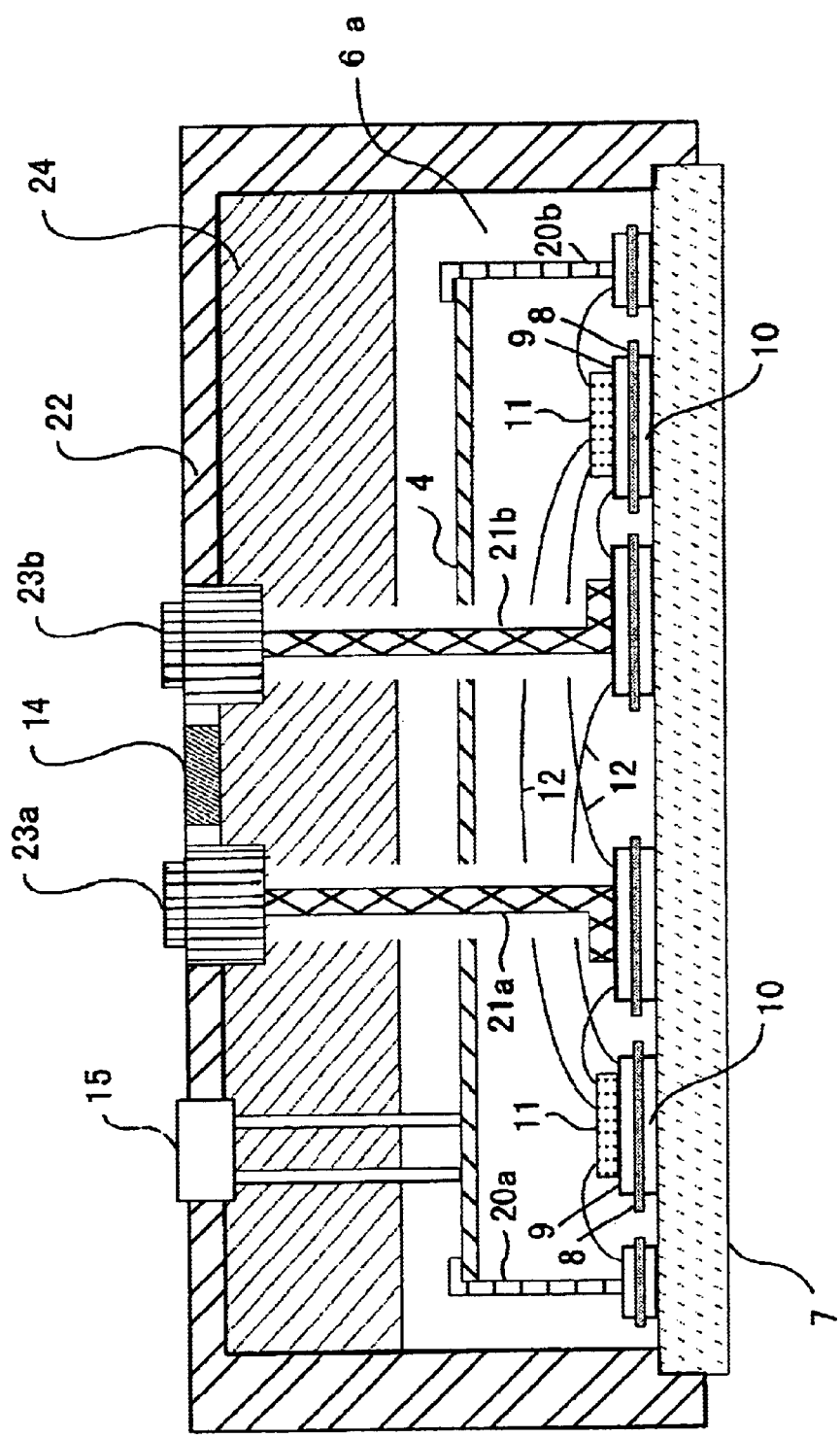
FIG. 2 is a cross-sectional side view showing the second embodiment of a power semiconductor device according to the present invention.

FIG. 2 is a cross-sectional side view illustrating a power semiconductor device of another embodiment for carrying out the present invention. This embodiment is different from the First Embodiment in structure to introduce an electric current.

A control board 4 is laid over power semiconductor chips 11 and supported by relay electrodes 20a, 20b. Brace electrodes 21a (corresponding to the emitter plate 1 in FIG. 1) and 21b (corresponding to the collector plate 2 in FIG. 2) are respectively connected with external electrode terminals 23a, 23b mounted on the casing member 22. Since aluminum wires 12 connect the power semiconductor chips 11 and upper substrate electrodes 9 with each other, the brace electrodes 21a, 21b keep themselves from weighting directly down to the power semiconductor chips 11 and the control board 4.

A resin member 6a seals and covers the power semiconductor chips 11 and the control board 4. A structural resin member 24, made of curable resin having a high strength (for example, epoxy resin), covers the brace electrodes 21a, 21b and occupies a space above an upper surface of a resin member 6a. The structural resin member 24 firmly holds the brace electrodes 21a, 21b and the external electrode terminals 23a, 23b. A lid 14 is adhered to an upper portion of the case 22 to which a metal base plate 7 is fixedly attached. The case 22 and the metal base plate 7 constitute a casing member.

The power semiconductor device shown in FIG. 2 has less void occurring portions than the power semiconductor device shown in FIG. 1, because the brace electrodes 21a, 21b eliminate the installment of the insulation plate 3. Further, utilization of the semiconductor sealing resin A makes it possible to prevent the formation of voids, cracks and interfacial peeling-off and the rupture of the aluminum wires 12 at a heat cycle test, a power cycle test or a vibration test and, therefore, the reliability of the power semiconductor device is enhanced.

Here, the control board 4 may be located outside the casing member which includes the case 22 and the metal base plate 7. Providing the control board outside the casing member decreases the number of portions where the stress of the resin member 6a is concentrated when the heat cycle test, the power cycle test or the vibration test are performed. As a result, the formation of voids, cracks and interfacial peeling-off and the rupture of the aluminum wires 12 are suppressed and, then the power semiconductor device enhances its reliability. Further, providing the control board outside the casing member makes the exchange of the control board easy and hence versatile demands of the power semiconductor device is more easily accomplished to lower the fabrication cost.

Hereafter method of preparing the semiconductor sealing resin A is explained based on several Examples. The semiconductor sealing resin A is prepared based on physical properties of a cured silicone resin, which is obtained by treating the resin at a given temperature for given time, such as penetration number, percent elongation after fracture and elasticity. FIG. 3 shows the characteristics of 31 kinds of silicone resins prepared under various conditions (products of TORAY DOW CORNING SILICONE Corp.).

The physical properties were measured at a room temperature (25° C.) unless otherwise noted. The silicone resin of one-liquid component type (I) and two-liquid component type (II) can be used depending on the application. The power semiconductor device shown in FIG. 1 is used in a heat cycle (HC) test.

EXAMPLE 1

Penetration Number and Percent Elongation After Fracture

The penetration number is obtained by placing a cone having a given shape (102.5 g) on a cut surface of a sample for 5 seconds and, then, measuring the depth of the cone into the sample in mm. The penetration number is also called "consistency" (JIS-K2220). The samples for the measurement of penetration number were treated with a cutter to prepare a fresh cut surface of a cured silicone resin.

The percent elongation after fracture was determined in accordance with "Testing Method of the Tensile Shearing Adhesion Strength for Adhesive-Rigid Materials Using the Adhered Test Samples (JIS-K6850)". The test sample was prepared by adhering two sheets of plate-like cured silicone resins (100 mm×25 mm×1.6 mm) with each other by setting an adhesive area to 25 mm×12.5 mm and an adhesive layer to 0.1 mm in thickness. A tensile test machine applied a tensile force to the sample in the direction of the sample's longitudinal axis and measured the length of the sample just before the fracture at the adhesive portion. The percent elongation after fracture was obtained by comparing the length of the sample just before the fracture with the length before the test. Autograph AG-5000D (made of SHIMADZU) performed the measurement at a testing speed of 1 mm/min.

The penetration number and the percent elongation after fracture of the resin No. 10 were 55 (mm) and 6.5 (%) respectively. A heat cycle test on the power semiconductor device sealed with resin No. 10 leaded to no cracking in a resin member 6a. Here the heat cycle test repeated a cycle 1000 times to hold the power semiconductor device at a temperature of −40° C. for 30 minutes and then at a temperature of 125° C. for 30 minutes.

With respect to the resin No. 30, the penetration number was 55 (mm) and the percent elongation after fracture was 1.5 (%) and cracking was formed in a resin member 6a by the heat cycle test. Results obtained by determining 31 kinds of silicone resins in the same manner are shown in FIG. 4. In the table, the columns are arranged in the order of increasing penetration numbers.

Figures 5, 6:
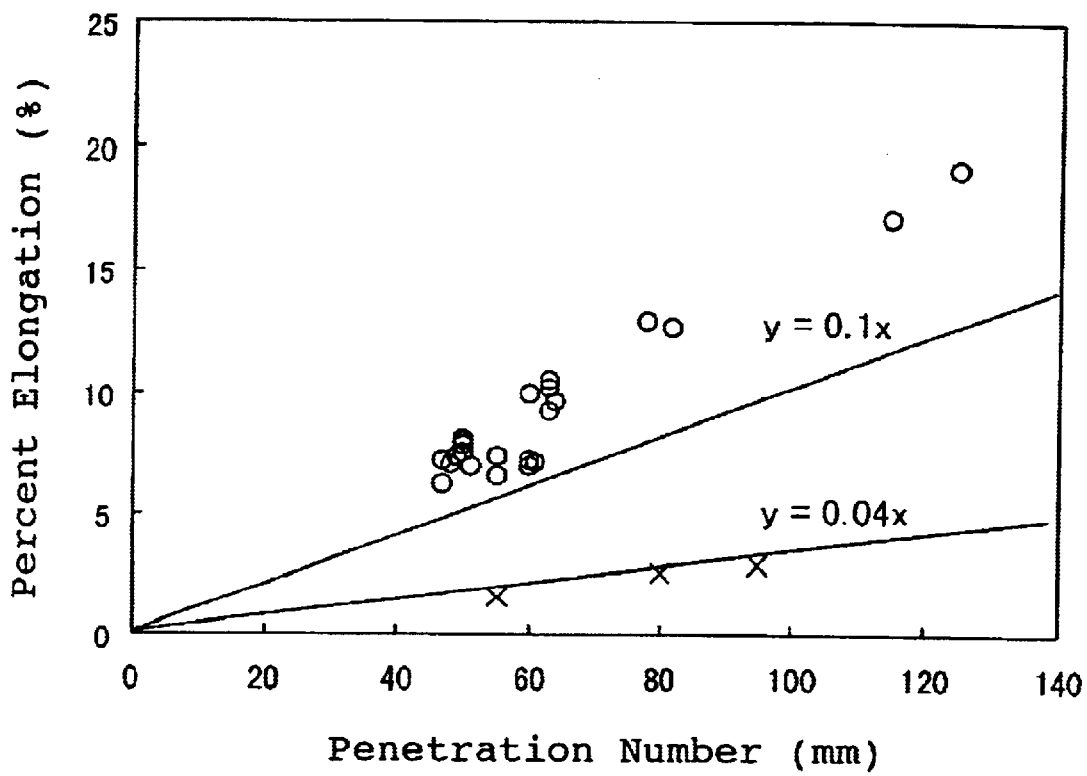
FIG. 5 is a view for explaining the relationship between a penetration number and a percent elongation after fracture of a semiconductor sealing resin.
FIG. 6 is a table for explaining results obtained by investigating a temperature dependency of a penetration number.

FIG. 5 shows an analysis of the relationship among the penetration number, the percent elongation after fracture and the heat cycle test, where "o" indicates that no cracks were formed and "X" indicates that cracks were formed in the heat cycle test. Assuming that a penetration number of a test sample x (mm) and a percent elongation after fracture y (%), the silicone resins which developed cracking in the heat cycle test were on a straight line which passes an origin (y=0.031 x). Straight lines having inclinations of 0.04 and 0.1 are indicated in FIG. 5. On the contrary, the silicone resins which developed no cracking were all present in an area above these straight lines. Here, a resin with the penetration number of zero has a percent elongation after fracture of zero.

It can be understood from FIG. 5 that the silicone resin with a larger ratio of the percent elongation after fracture to the penetration number develops less cracking. FIG. 5 indicates presumably that the formation of cracks is predicted simply by measuring physical properties such as the penetration number and the breaking elongation.

Although a larger ratio of the percent elongation after fracture to the penetration number is desirable, one criterion is that the ratio is not less than 0.04. When the ratio of the percent elongation after fracture to the penetration number is not less than 0.1, the resin is further preferable for rendering substantially no cracking and obtaining sufficient gel characteristics for simple handling.

EXAMPLE 2

Penetration Number

FIG. 4 also shows the results of investigation as to whether the heat cycle test leaded to the void formation in the power semiconductor device of the First Embodiments. With respect to the resin No. 29 having the penetration number of 80, cracks and voids were formed in the heat cycle test. With respect to the resin No. 18 having the penetration number of 82, neither cracks nor voids were formed in the heat cycle test.

FIG. 4 shows that a cured silicone resin with a smaller penetration number tends to form less voids. When the voids are formed, the breakdown voltage is decreased. Accordingly, it is desirable that the penetration number is made as small as possible. One criterion is that the penetration number is smaller than 80. It is more preferable that the penetration number is lower than 70 for the less formation of the voids. However, a cured silicone resin with an excessive low penetration number shows insufficient gel characteristics and hence the resin handling is made more difficult and, further, more cracks are formed. Accordingly, it is desirable that the penetration number is not less than 10.

By adjusting the penetration number of the silicone resin to 10–80 and more preferably to 10–70, it becomes possible to avoid the formation of voids from gaps in the power semiconductor device at the heat/power cycle test or the rupturing of the aluminum wires 12 at the vibration test. The avoidance of the formation of voids and the rupturing of the aluminum wires also enhances the reliability of the semiconductor device.

EXAMPLE 3

Temperature Dependency of the Penetration Nunber

Four kinds of cured silicone resins having the penetration numbers around 60 at a room temperature were selected and their penetration numbers at −80° C. were measured to compare the results of the heat cycle test, where a cycle to hold a power semiconductor device at a temperature of −55° C. for 30 minutes and then hold it at a temperature of 125° C. for 30 minutes was repeated 1000 times.

First, the penetration number of a sample which was refrigerated to −80° C. was measured and, second, the sample was gradually heated up to a room temperature to measure a penetration number thereat. FIG. 6 shows determined results. The table in FIG. 6 displays the ratios (%) of the penetration numbers measured at −80° C. relative to those measured at 25° C.

It can be understood from FIG. 6 that the silicone resin having a smaller ratio in penetration number is more liable to form cracking. Therefore, the results of the heat cycle test in a wide temperature range of −55° C. to 125° C., for example, can be known by comparing the penetration numbers at a room temperature and at −80° C.

Although a larger ratio of the penetration number is desirable, one criterion is that the ratio is not less than 50%. As long as the ratio of the penetration number is kept not less than 50%, no cracks are found in a heat cycle test of −55° C. to 125° C., for example. A ratio of the penetration numbers not less than 70% is further desirable, since cracks are less formed even in a heat cycle test at a lower temperature.

The cured silicone resin having the ratio in the penetration number, preferably not less than 50%, and more preferably not less than 70% exhibits a relatively high elasticity even under the chilled temperature. Accordingly, it becomes possible to prevent the formation of voids, cracks and interfacial peeling-off and the rupture of the aluminum wires at a low-temperature heat cycle test, a power cycle test or a vibration test, and hence the reliability of the power semiconductor device can be enhanced. The silicone resin has a particular effect on power semiconductor devices designed for automobiles or electric trains which are required to satisfy the chilly-district specification.

Figure 7:
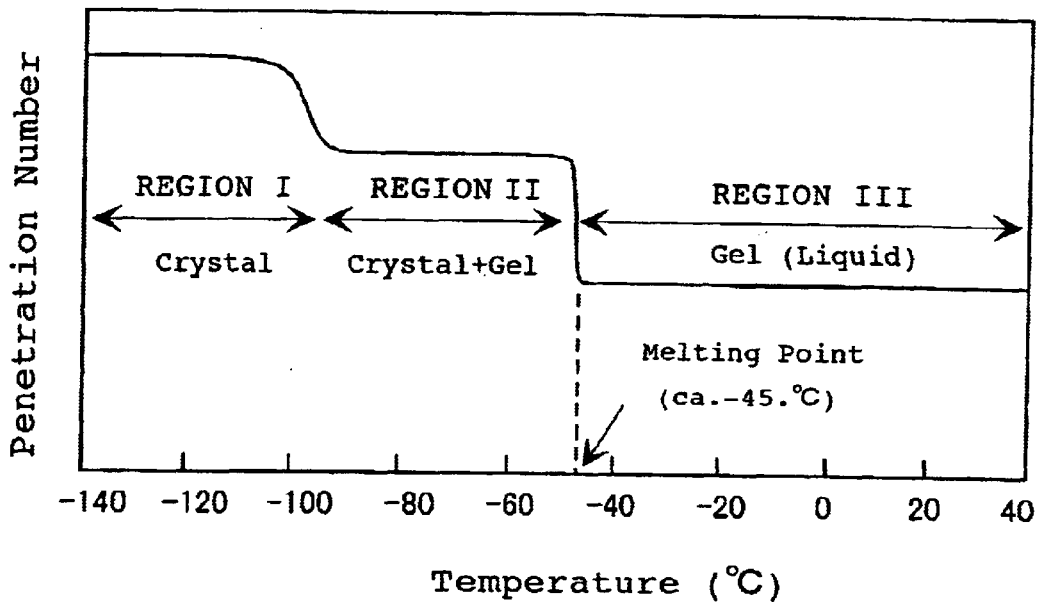
FIG. 7 is a view for explaining that a silicone resin has a triple state which depends on temperature.

Here, the complementary explanation on the relationship between the penetration number of the silicone resin and the temperature is given in FIG. 7, which schematically shows the temperature dependency of the penetration number. Silicone resin exhibits a triple state consisting of crystal (REGION I), crystal+gel (REGION II) and gel (REGION III) and each REGIONS have featuring penetration numbers. The gel may be called a liquid.

The REGIONS II and III have a boundary in the vicinity of −45° C. called a melting point. The penetration number and the elasticity usually change their values largely before and after the melting point. In the Example 3, a temperature of −80° C. is selected as a point which represents the REGION II of crystal+gel (liquid), however, the measuring temperature at the chilly side is not limited to −80° C.

EXAMPLE 4

Shear Elasticity

A cylindrical sample of cured silicone resin (φ25 mm×4 mm) was prepared and the relationship between the results of a dynamic test and the formation of cracks was studied.

The dynamic test measures the response of a material which is applied a sinusoidal periodic force. Since stress and distortion are generally different in phase, elasticity and phase angle (or attenuation angle) can be determined. The result of a dynamic test gives a complex shear elasticity (G*) defined by the following equation ("Mechanical Properties of Polymers and Composite materials", L. E. Nielsen, KAGAKU DOUJIN, 1976)

$$G^* = G' + iG''$$

Here, a real part of the complex shear elasticity (G*) is called a storage elasticity (G') and an imaginary part is called a loss elasticity (G"). Both elasticity are physical properties which depend on the frequency of the periodic forces. While the storage elasticity (G') tends to gradually increase with the increase of the frequency and approach a given value (rigid elasticity), the loss elasticity (G") tends to increase with the increase of the frequency at a first stage, reach a peak at a central portion of the frequency and then decrease. DYNAMIX ANALYZER-RDA (made of Rheometrics Ltd.) was used to measure the shear elasticity at a temperature of 25° C., by setting the frequency to 10 Hz, 1 Hz and 0.1 Hz.

Figure 8:
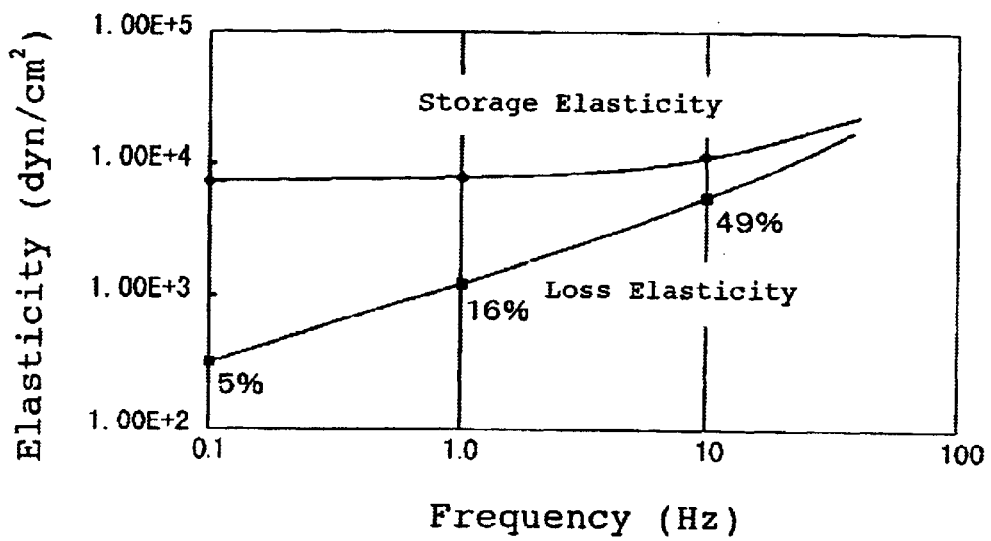
FIG. 8 is a view for explaining a relationship between the storage elasticity and the loss elasticity of Resin No. 29.
Figure 10:
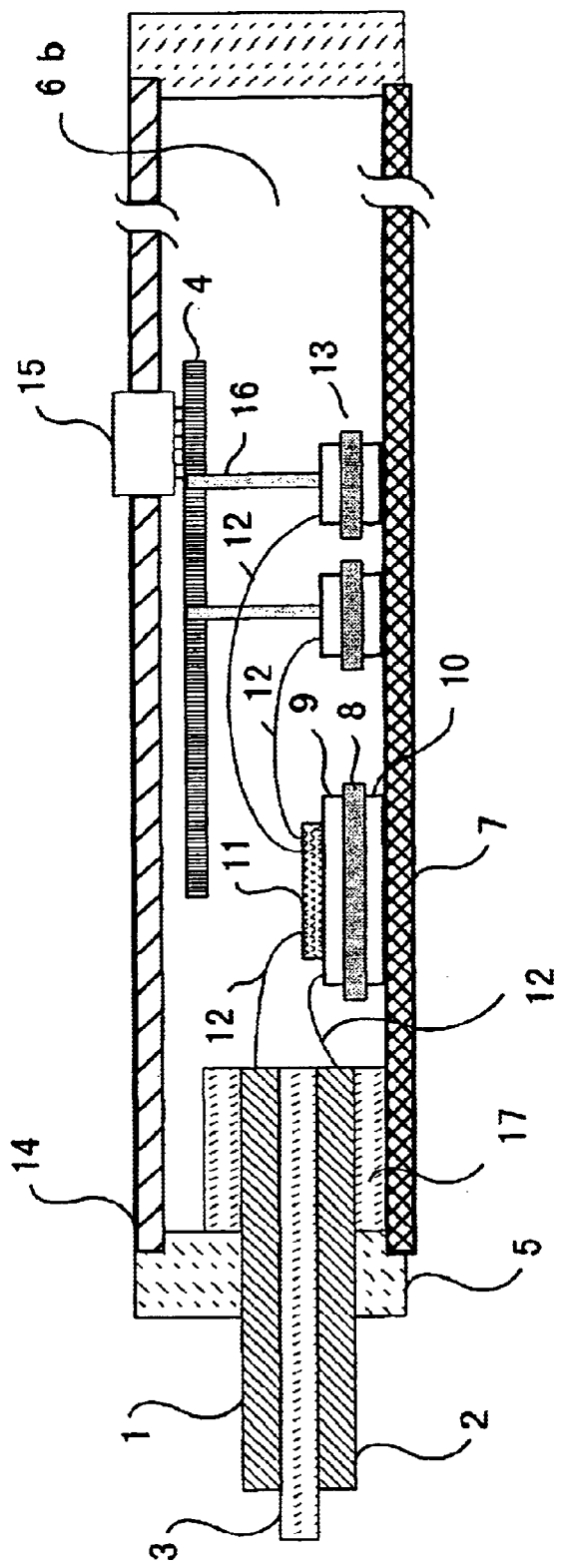
FIG. 10 is a cross-sectional side view of a conventional power semiconductor device.

The storage elasticity (G') and the loss elasticity (G") of resin No. 29 are shown in FIG. 8. The difference between the storage elasticity and the loss elasticity is more clearly exhibited at a lower frequency. The percent ratio of the loss elasticity (G") to the storage elasticity (G') is indicated in the Figure. While the ratio of the loss elasticity (G") to the storage elasticity (G') is 16% at the frequency of 1 Hz, the ratio is 5% at the frequency of 0.1 Hz. When a power semiconductor device is fabricated by using the resin No. 29 and the heat cycle test was performed on the power semiconductor device, cracking was formed on a resin member.

Five kinds of silicone resins were evaluated in the same manner and the results, in view of the shear elasticity, are shown in FIG. 9. The results indicate that a cured silicone resin having a larger ratio of the loss elasticity (G") to the storage elasticity (G') forms cracking to lesser extent. Although it is desirable that the ratio of the loss elasticity (G") to the storage elasticity (G') is set as large as possible, one criterion is that the ratio is not less than 17%.

Provided that the frequency is set in a range of 0.1 to 1 Hz, no cracks were formed at a usual heat cycle test in a semiconductor device which was sealed with the semiconductor sealing resin of which the ratio of the loss elasticity (G") to the storage elasticity (G') was adjusted to not less than 17%, and hence such a criterion is preferable. It is more preferable to adjust such a ratio to not less than 20% since the formation of cracks is reduced.

EXAMPLE 5

Cure Temperature

It is considered preferable to store silicon resin at a temperature of about −5° C. Substantially the silicon resin doesn't cure at this temperature, however, the curing of the resin gradually proceeds with the rise of temperature. An elevated temperature shortens a cure time. Columns titled "Storage Stability" in FIG. 3 list storage temperatures and storage lives of the sample resins.

The cure temperature of the semiconductor sealing resin A is adjusted to a temperature not more than the highest temperature of a heat cycle test. To be more specific, the cure temperatures fall within a range from 70° C. to 125° C. as shown in FIG. 4. Since the cure temperature depends on the cure time, a standard cure time is set to 1 to 2 hours.

Since the cure temperature is lower than the highest temperature of the heat cycle test, the stress in the power semiconductor device, particularly in the resin member 6a, decreases in the heat cycle test. For example, resin No.22 had no recognizable influence on aluminum wires 12 at a temperature of 80° C. (cure time: 2 Hours).

Decreased stresses in the resin member 6a have an enhanced effect on the prevention of cracking and interfacial peeling-off. Further, stresses applied to the aluminum wires 12 also decrease, so that the rupture of the aluminum wires 12 can be prevented. Therefore, the necessary features on insulation breakdown or partial discharge are ensured, for example, a breakdown voltage of more than 6.0 kV/mm and a starting voltage for partial discharge of more than 3.3 kV are obtained for the power semiconductor device.

EXAMPLE 6

V-1 Evaluation

FIG. 4 also shows the results of flame resistance test for the semiconductor sealing resin. The test was performed in accordance with VERTICAL BURNING TEST FOR CLASSIFYING MATERIALS (UL94-1980–1985). Cured silicone resins which satisfied the acceptance criterion V-1 are indicated by "o" and cured silicone resins which did not satisfy the acceptance criterion V-1 are indicated by "X" in the Figure.

The cured silicone resins which satisfy the acceptance criterion V-1 don't burn with flames over 30 seconds even after keeping them from contacting with flames. The semiconductor sealing resin with a flame resistance in accordance with V-1 delays the combustion rupture on a fire case, so the reliability of the semiconductor device can be enhanced.

The characteristics of the semiconductor sealing resin described in the Examples 1 to 6 are cross-linked each other. A semiconductor sealing resin which satisfies a plurality of characteristics is available and can cope simultaneously with a plurality of causes which lower the performance of the power semiconductor device. For example, resin No. 14 satisfies all the characteristics.

EXAMPLE 7

Filler

It has been found that a filler having a low coefficient of linear thermal expansion mixed with the semiconductor sealing resin suppressed the interfacial peeling off or cracks which were formed between the semiconductor sealing resin and the ceramic substrate 8 or the power semiconductor chip 11 in the heat/power cycle tests. In addition to a low coefficient of linear thermal expansion, the filler is required to satisfy several properties including the excellent electric insulation, the breakdown voltage not less than 15 kV/mm, and the least corrosive reactivity with a silicone resin (base material). Inorganic compounds such as silica or alumina are included among examples of the filler. These inorganic compounds are hardly corroded even when subjected to a partial discharge.

When resin No. 14 was mixed with silica particles of a spherical shape (diameter of 10 μm) by 50% in weight, the cured silicone resins lowered the coefficient of linear thermal expansion from $1 \times 10^{-3}$ /° C. to $0.3 \times 10^{-3}$ /° C. Filler compounds which allow the similar effect include metal oxides ($TiO_2$, $LiO_2$, ZnO, CaO, MgO, FeO, SnO, $Sb_2O_3$), metal nitrides (BN, AlN), metal hydroxides ($CaOH_2$, MgOH, Al(OH)$_3$), metal organic acid salts (CaSiO$_3$, MgCO$_3$, ZnCO$_3$, BaCO$_3$, CaSO$_4$, BaSO$_4$), metal inorganic acid salts (CaSiO$_3$, CaTiO$_3$, MoS, Zn(BO$_3$)$_2$), organic high polymers (polystyrene, polyacrylic, polyphenol, polybutadiene) and the like.

It is an advantage of the above-mentioned compounds that they can be easily obtained and easily processed. Among these compounds, the organic high polymers have substantially the same specific gravity as the silicone resin has. Therefore, the organic high polymers easily disperse in the silicone resin uniformly, thus exhibiting the excellent handling. There is no particular restriction on the shape of the filler. While fillers with a spherical-shape, a granular-shape, a plate-like-shape, a flaky-shape, an irregular-shape, a sponge-shape, a needle-shape, a twig-shape, or a hollow-shape may be equally used, the filler having the spherical shape is preferred since such a filler can be easily obtained.

Fillers, added to the silicone resin of base material by ca. weight 10%, make the coefficient of linear thermal expansion outstandingly small. Although it is necessary to add filler not less than 30% by weight to the silicone resin to obtain a sufficient lowering effect on the coefficient of linear thermal expansion, an addition of fillers exceeding 80% renders the viscosity high and hence, cracking is more liable to be formed. Accordingly, it is desirable to add fillers of 10% to 80% by weight to the silicone resin, and further desirable to add fillers of 30% to 80% by weight to the silicone resin, which constitutes the base material of the sealing resin.

When a filler having a low coefficient of linear thermal expansion is mixed with the silicone resin, the resin member becomes similar to the insulation plate 3, the power semiconductor chip 11 or the control board 4 in coefficient of linear thermal expansion. Then, the formation of cracking and interfacial peeling-off is avoided and the reliability of the power semiconductor device is enhanced.

We claim:

1. A semiconductor device comprising:
    a semiconductor chip fixedly located over a metal base plate;
    a resin member made of a cured silicone resin and sealing the semiconductor chip, the cured silicone resin having a percent elongation after fracture, measured at room temperature, which is not less than 4% of a penetration number at room temperature; and
    a casing member surrounding the resin member and externally supplying electric power to the semiconductor chip, the cured silicone resin being substantially free of cracks after a heat cycle test.

2. The semiconductor device according to claim 1, wherein the cured silicone resin has a penetration number at a room temperature of not less than 10 and not more than 80.

3. The semiconductor device according to claim 2, wherein the cured silicone resin has a penetration number measured at −80° C. not less than 50% of the penetration number measured at room temperature.

4. The semiconductor device according to claim 1, wherein the cured silicone resin has a loss elasticity not less than 17% of a storage elasticity in a frequency range of 0.1 Hz to 1 Hz, at room temperature.

5. The semiconductor device according to claim 1, wherein the cured silicone resin has a cure temperature not higher than the highest temperature of the heat cycle test.

6. The semiconductor device according to claim 1, wherein the cured silicone resin satisfies flame resistance criterion V-1.

7. The semiconductor device according to claim 1, wherein the resin member includes a filler having a coefficient of linear thermal expansion lower than a coefficient of linear thermal expansion of the cured silicone resin without the filler.

8. The semiconductor device according to claim 7, wherein the filler is made of a compound selected from the group consisting of a metal oxide, a metal nitride, a metal hydroxide, a metal organic phosphate, a metal inorganic phosphate, and an organic high molecular weight polymer.

9. The semiconductor device according to claim 8, wherein the resin member includes a filler in a range of 30–80% by weight of the weight of the silicone resin.

10. The semiconductor device according to claim 1, wherein the casing member includes an external terminal base for externally supplying control signals to the semiconductor chip.

11. The semiconductor device according to claim 1, further comprising a structural resin member made of a curable resin on an upper surface of the resin member and surrounded by the casing member, the structural resin member sealing an emitter electrode and a collector electrode which supply electric power to the semiconductor chip.

* * * * *